United States Patent [19]

Jackson et al.

[11] 3,762,029

[45] Oct. 2, 1973

[54] MANUFACTURE OF SUPPORTS FOR SEMICONDUCTOR DEVICES

[75] Inventors: Sydney Jackson, Hayfield; Joseph Bell Titterington, Burnley, both of England

[73] Assignee: Ferranti Limited, Lancashire, England

[22] Filed: June 12, 1972

[21] Appl. No.: 261,686

Related U.S. Application Data

[63] Continuation-in-part of Ser. No. 27,478, April 13, 1970, abandoned.

[52] U.S. Cl. ........... 29/470.1, 29/497.5, 317/234 M

[51] Int. Cl. ........... B23k 21/00

[58] Field of Search ........... 29/471.1, 470.1, 29/493, 497.5, 475, 471.3, 630 R, 591; 317/234 M, 234 L

[56] References Cited

UNITED STATES PATENTS

| | | | |
|---|---|---|---|
| 2,820,135 | 1/1958 | Yamahawa | 29/630 R |
| 3,197,843 | 8/1965 | Nippert | 29/591 X |
| 3,561,084 | 2/1971 | Sims | 29/25.15 |
| 3,634,934 | 1/1972 | Fitzgerald | 29/630 R |

*Primary Examiner*—Richard B. Lazarus
*Attorney*—Edward J. Kondracki

[57] ABSTRACT

In manufacturing a support such as a lead frame for a semiconductor device, alloying material such as gold is selectively applied in sufficient thickness for the device bonding operation to a part only of a supporting member of the support, by impacting an initially-spherical particle of the alloying material onto the selected part by an unheated impacting tool, the particle possibly initially being secured on the selected part by slight impacting under a suction tool.

10 Claims, 10 Drawing Figures

MANUFACTURE OF SUPPORTS FOR SEMICONDUCTOR DEVICES

Figure 1:
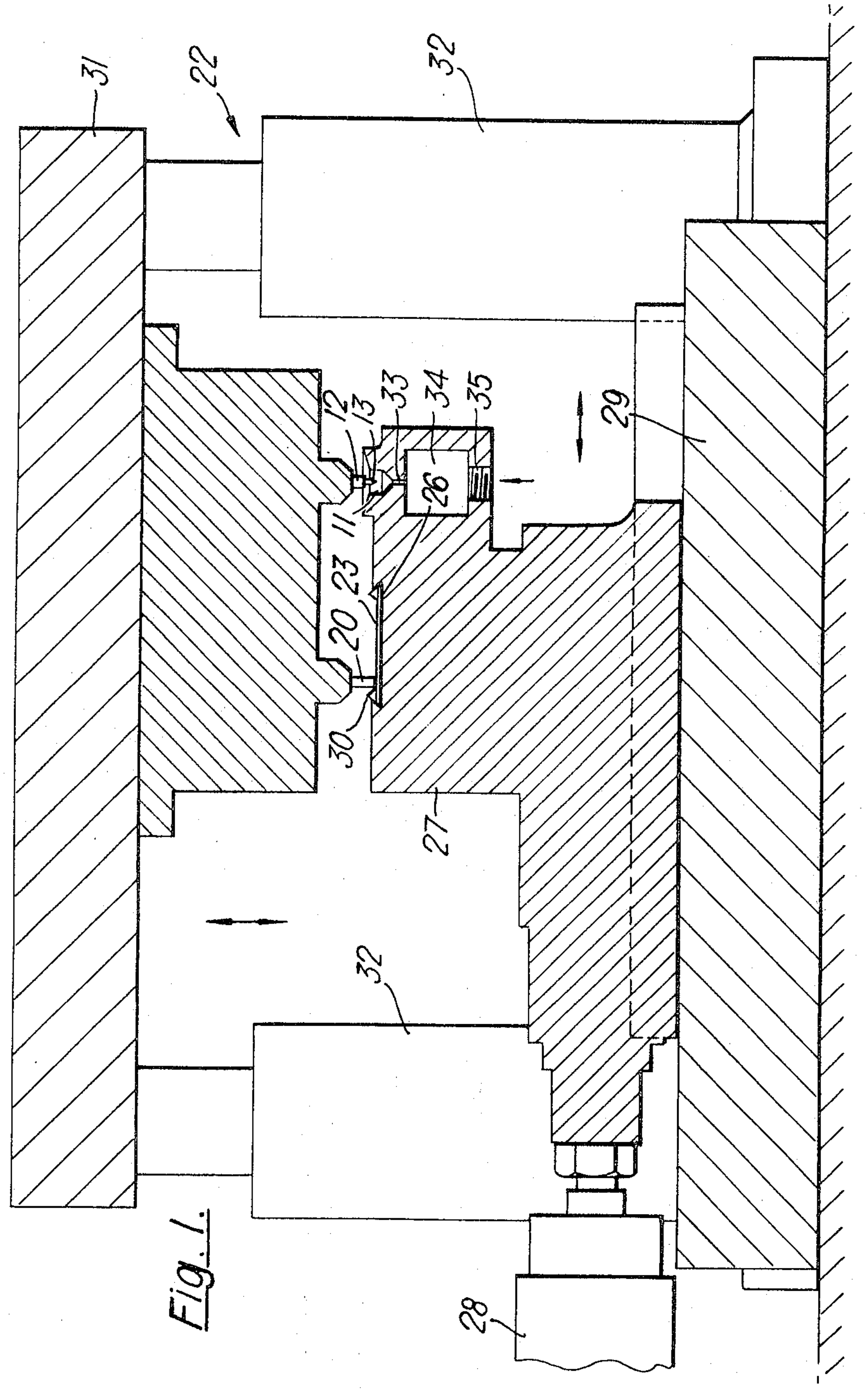

This application is a continuation-in-part of Ser. No. 27,478 filed 13th Apr. 1970 and now abandoned. This invention relates to the manufacture of supports for semiconductor devices.

A support, comprising part of a package in which the device is encapsulated, and from which package extend conductors connected to contacts for the device, may comprise a conventional header arrangement or may be provided by part of a lead frame comprising a preformed matrix of conductors. With the latter form of support the device may be encapsulated in a plastics material such as an epoxy resin and the package may comprise a so-called "flat-pack". The semiconductor device usually comprises a wafer and may comprise a discrete circuit element such as a transistor, or it may comprise an integrated circuit.

It is usual to provide between at least some of the device contacts and the conductors electrical interconnections in the form of small-diameter wires of gold or possibly of aluminum. A further electrical interconnection possibly may also be provided by bonding the semiconductor wafer to a conductor comprising part of the support by an intermediate conducting layer. In either event, the bonding layer usually includes an alloying material such as gold which alloys with the semiconductor material forming a eutectic mixture especially suitable for bonding the wafer to a supporting member of the support, whilst the wires are secured to the conductors by known thermo-compression bonding techniques. Hence, the whole of the appropriate face of the supporting member of the support may be precoated with gold, but the thickness of gold on the part of the face to which the wafer is to be bonded may be arranged to be significantly greater than the gold thickness on the remainder of the face; or the initial composition of the remainder of the face may be substantially wholly without the alloying material. In order to avoid using an unnecessarily large amount of the alloying material, which material in the case of gold is expensive, it has been known to apply an initially-uniform thickness of the alloying material, of a thickness sufficient for the wafer bonding operation, over the whole of the face, and subsequently removing and recovering substantially all of the parts of the material not employed in the water bonding. Alternatively, the material used in the wafer bonding, in the form of a preformed blank of the minimum requisite dimensions, has been secured to the selected part of the supporting member by a scrubbing action. Both these ways of bonding the wafer to the support add to the complexity of the manufacturing of the support, and in the latter way of bonding the wafer it is difficult to ensure that the preformed blank is reliably bonded to the supporting member.

It is an object of the present invention to provide a method of manufacturing a support for a semiconductor device, which method avoids the necessity of either having initially to coat the whole of the appropriate face of the supporting member with the material to be used to form an intermediate bonding layer between the semiconductor wafer and the supporting member, or having to employ a scrubbing action in order to secure this material to the selected part of the supporting member.

According to the present invention a method of manufacturing a support for a semiconductor device comprises the steps of providing a supply of spherical particles of a suitable bonding material, selecting any one of such particles, transporting the selected particle to and depositing it on a selected part of a supporting member, and bonding said particle to the selected part by impacting the particle into the surface of said selected part by an impacting tool to thereby deform the selected part and bond the selected particle to the supporting member at the location of the selected part.

A suitable particle material is gold, and a particle of gold may be impacted onto a surface of gold, silver, copper or aluminium to be secured thereto with a satisfactory bond. It is also possible to obtain such a bond between particles of silver, or aluminum or copper and a surface of any one of these metals or of gold. In accordance with the present invention, a bond between some such combinations of metals for the particle and the surface of the selected part of the supporting member may be formed solely by the impact between the particle and the surface. With other such combination for the metals it may be essential or desirable that heat is supplied during the bonding operation, as described and claimed in the applicant's co-pending application Ser. No. 27,478, the present application being a continuation-in-part of Ser. No. 27,478.

Figures 2A, 2B:
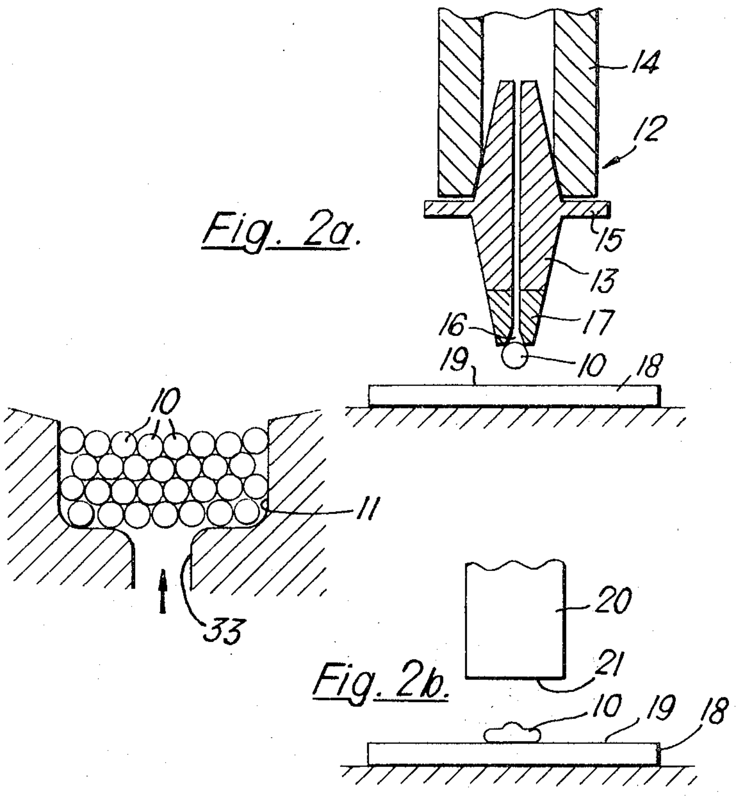
Figure 2C:
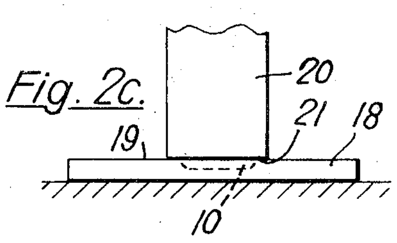
Figure 2D:
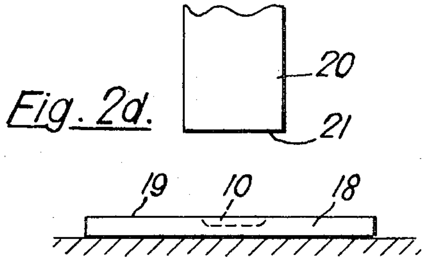
Figure 3:
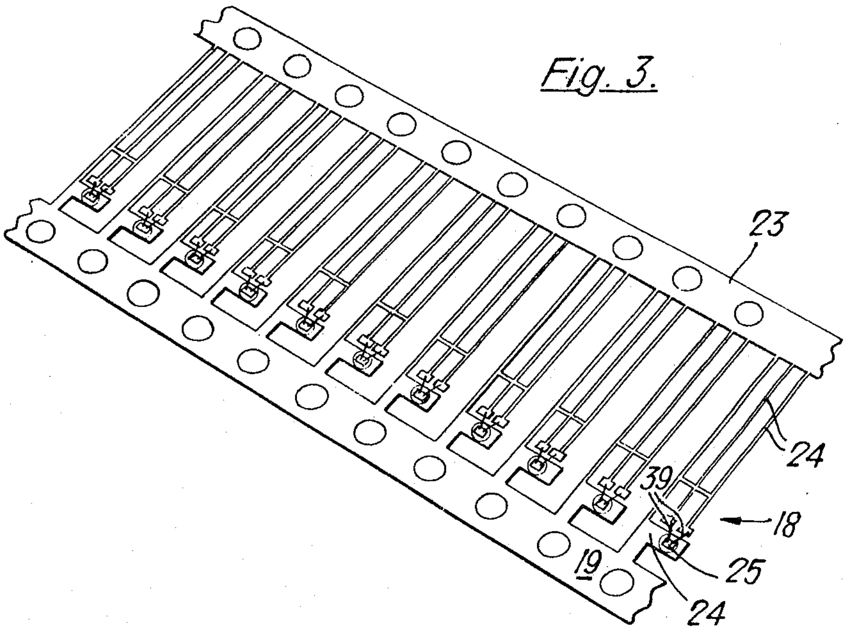
Figure 4:
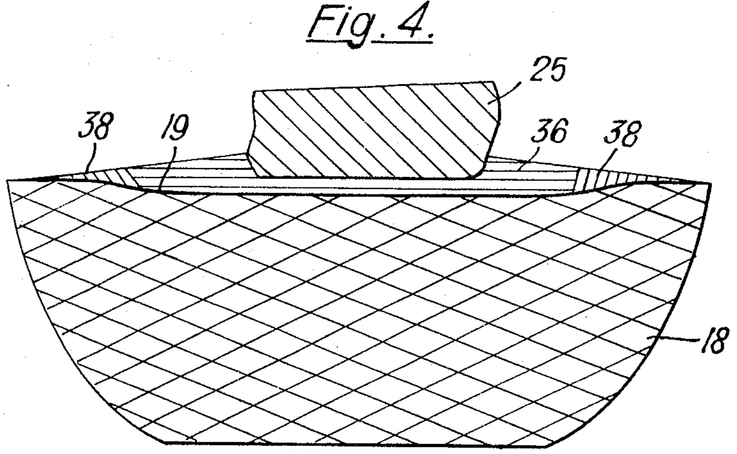
Figure 5:
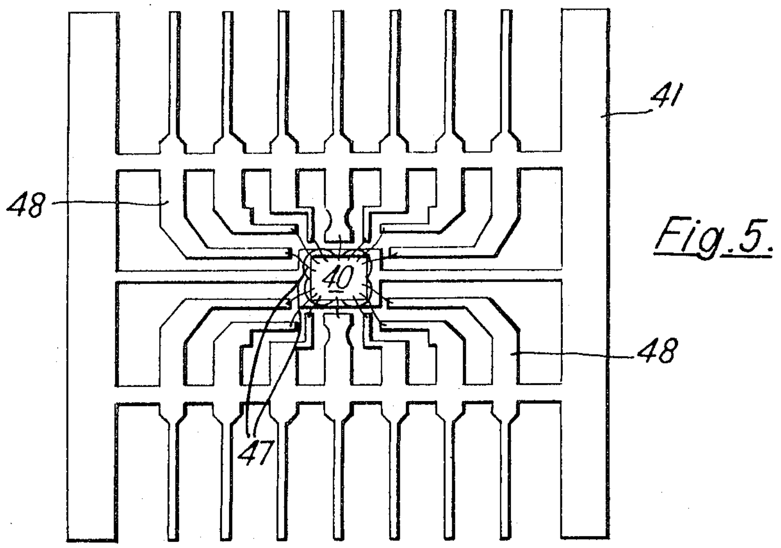
Figure 6:
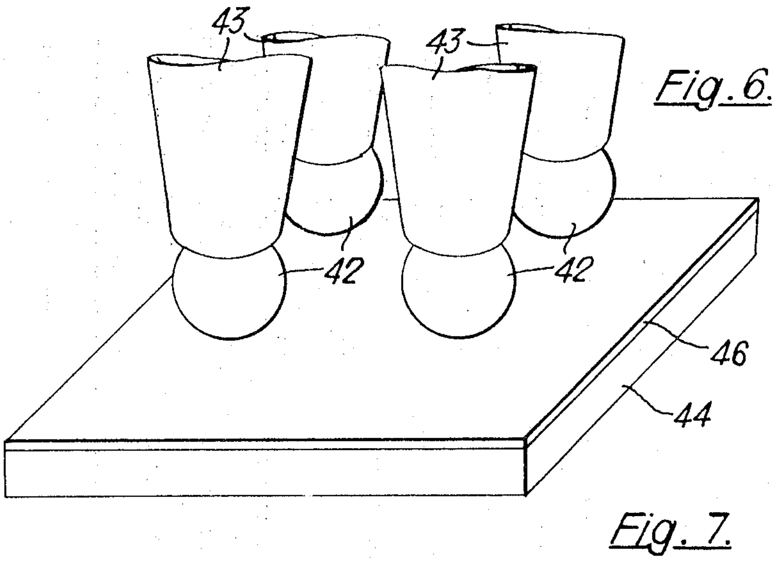
Figure 7:
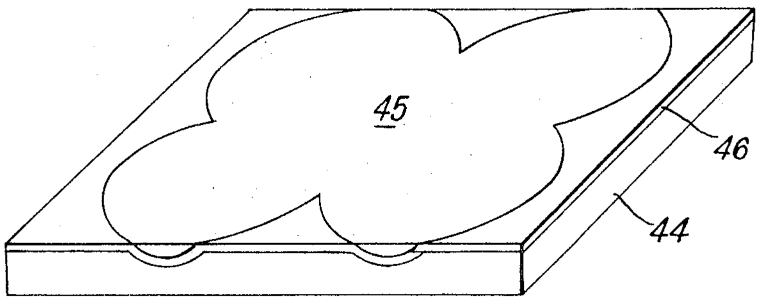

The present invention will now be described by way of example with reference to the accompanying drawings, in which FIG. 1 is a section through apparatus for bonding a spherical gold particle onto part of a lead frame comprising a supporting member of a support for a semiconductor device, FIG. 2*a* to 2*d* show successive stages in the bonding of the spherical gold particle onto the lead frame by employing the apparatus of FIG. 1, FIG. 3 shows a plurality of semiconductor wafers, each wafer comprising a transistor, the wafers being alloyed to a preformed, integral strip of lead frames, FIG. 4 is a diagrammatic representation of a photomicrograph of a section through the lead frame and the semiconductor wafer, when the device is alloyed to the gold which is bonded to the lead frame by the apparatus of FIG. 1, FIG. 5 is a plan view of a semiconductor wafer compri-sing an integrated circuit, this wafer being shown when alloyed to a lead frame in a manner in accordance with the present invention, FIG. 6 shows four gold spherical particles used to bond the integrated circuit of FIG. 5, the particles being shown when securely held by suction tools before being placed onto the lead frame, and FIG. 7 is a perspective view of the support comprising the lead frame of FIG. 5 with the gold bonded on the lead frame.

The method of manufacturing a support for a semiconductor wafer comprising a semiconductor device, the support including a supporting member comprising a matrix of conductors in the form of a lead frame, is illustrated in FIGS. 1 to 4, and comprises selecting a spherical gold particle 10 from a storage bin 11 for such spherical particles by a conventional suction tool 12. The suction tool 12 is shown in section in FIG. 2*a* and comprises a nozzle 13 detachably secured to a pipe 14 by magnetic means (not shown), and is provided with a flange 15 which locates the nozzle 13 within the end of the pipe. The pipe 14 is connected to vacuum-producing means (not shown) and a pressure is created at an orifice 16 provided by the nozzle 13, which pressure is arranged to be sufficient for a particle 10 to be selected positively and individually from the bin 11 and to be securely held in contact with the orifice 16. These criteria are obtained because the particle is initially in the form of a sphere. The orifice 16, which is provided in a polished tungsten carbide end-piece 17 of the nozzle 13, is circular and has a diameter smaller than the diameter of the spherical particle, so that the particle 10 acts as a shut off valve when it is secured to the orifice. The endpiece 17 is heated to a temperature of 300° C by conventional means (not shown). The suction tool 12 then transports the particle over a selected part of the lead frame 18 to which the semiconductor wafer is to be bonded, and the particle 10 is secured to the part by impact under the suction tool 12, the particle 10 being deformed as illustrated in FIG. 2*b*, by this step. The whole of the surface of the lead frame 18 to which the particle 10 is bonded is provided by a silver coating 19 (shown in detail in FIG. 4), on a lead frame substantially of a nickel-iron-cobalt alloy. Thus, the gold is thermo-compression bonded to the lead frame and will not adhere to the suction tool 12 after the vacuum within the nozzle 13 is removed. The silver coating 19 is provided by a known electrolytic deposition process onto an activated surface of the nickel-iron-cobalt alloy.

The bonding of the gold to the lead frame is completed by impacting the gold particle 10 with the impacting tool 20 shown in FIG. 2*b* to 2*d* to form the support for the semiconductor device. The impacting tool 20 is of tungsten carbide and has a highly polished, plane impacting surface.

Apparatus 22 which controls the action of the suction tool, and the movement of the suction tool and the impacting tool, and which also ensures that both tools make the required movements in the appropriate sequence is shown in FIG. 1. The apparatus 22 is capable of bonding gold particles 10 simultaneously to batches of sixteen lead frames 18, or multiples thereof. The lead frames 18 comprise a preformed, integral strip 23 of lead frames as shown in FIG. 3, each lead frame having three conductors 24 and being shown with a semiconductor device 25 comprising a transistor bonded to a selected part of each lead frame. The apparatus 22 bonds a gold particle 10 to each selected part of the lead frames in the manner described above. In the apparatus 22 the lead frame strip 23 is a close fit in a channel 26 formed in a carrier 27, which carrier 27 is oscillated in a horizontal direction, by a cylinder and piston arrangement 28, on a base plate 29. The channel 26 has side walls which are under-cut. Fingers 30 of an indexing mechanism (not otherwise shown) engage the lead frame strip 23 in the channel 26 and displace the strip 23 so that batches of lead frames 18 are moved successively into an operable position. In the operable position, and at each extremity of the movement of the carrier 27, the selected part of each lead frame 18 of the batch is directly beneath, respectively, an impacting tool 20 and a suction tool 12. The impacting tools 20 and the suction tools 12 are secured to a member 31 which is oscillated in a vertical direction by four cylinder and piston devices 32. For each co-operating impacting tool 20 and suction tool 12, the arrangement is such that when the impacting tool is above the selected part of a lead frame, the suction tool is above a bin 11 containing gold particles 10. When the impacting tool is dropped onto the selected part, the nozzle 13 of the suction tool enters the bin 11 and selects a gold particle 10. After the impacting tool is removed from the selected part, and the suction tool and the gold particle are removed from the bin, the next batch of lead frames 18 are moved into the operable position, and the carrier 27 is displaced to bring the selected part of a lead frame of the next batch of lead frames directly beneath the suction tool and gold particle. The suction tool is then lowered to cause the gold particle to adhere to the selected part of the lead frame, the suction tool is removed, and the carrier is displaced to bring the selected part under the impacting tool. The cycle of operations is then repeated until all the lead frames of the strip are provided with a gold particle. The apparatus is controlled by conventional means.

In order to prevent the gold spherical particles from becoming wedged with each other in the bins, nitrogen is supplied via a passage 33 to the lower part of each bin and from a common plenum chamber 34, the nitrogen being supplied to the plenum chamber via a screw-threaded orifice 35. The flow of nitrogen through each bin causes the gold particles to vibrate continuously, but not to such an extent that a particle is not positively selected by the nozzle of the suction tool upon entering the bin.

As shown in FIGS. 2*c* and 2*d* each gold particle forms a smooth surface with the lead frame surface. The gold then has bonded to it one major face of the silicon semiconductor wafer 25, in which wafer is embodied the transistor. The bonding of the wafer 25 is obtained in a conventional alloying apparatus, and, as shown in FIG. 4, an intermediate bonding layer 36 of gold-silicon eutectic is formed between the silver coating 19 on the lead frame 18 and the bonded wafer 25, except at the extremities 38 which remain as substantially pure gold.

FIG. 4, which represents a photomicrograph of a section through the semiconductor wafer 25, the intermediate bonding layer 36 and the lead frame 18, clearly shows the bond between the gold and the silver coating 19. The figure also shows the deformation of the lead frame supporting member beneath the bond, which deformation is a characteristic feature of a support for a semiconductor device manufactured in accordance with the present invention and which clearly shows the manner in which substantially the whole of particle 10 is impacted into the surface of the selected part of the lead frame 18.

The collector of each transistor 25 is bonded by the conductive, intermediate, bonding layer to a selected part of one of the conductors 24 of the lead frame 18. Gold wire electrical interconnections 39 are bonded to emitter and base contacts provided on the opposite major face of the semiconductor wafer 25 and to the other two conductors 24 of the lead frame as shown in FIG. 3. The wires 39 are bonded both to the device contacts and to the conductors 24 by thermo-compression means and thus the gold wires are bonded directly to the silver coating 19 on the appropriate face of the lead frame.

In providing the bonds between the gold particle 10 and the selected part of the lead frame 18, and between the gold wires 39 and the lead frame 18, it is essential to ensure that the surfaces to be bonded together initially are free from contamination. Thus, in order to avoid oxidation of the exposed surface of the silver coating, before the bonding steps referred to above are completed, this surface is provided with a thin "flash" of gold of substantially only molecular thickness. This gold coating is provided by an electro-less deposition process. The bonds are then performed in a non-oxidising atmosphere, such as nitrogen.

Subsequently the transistors are encapsulated in epoxy resin and the lead frames 18 of the strip 23 are separated from each other. The conductors 24 are removed from the other parts of the lead frame 18 so that electrically discrete conductors extend from each package comprising an epoxy-encapsulated device (not shown).

FIGS. 5 to 7 illustrate how a larger semiconductor device than a transistor, for example, an integrated circuit, may be bonded to a selected part of a lead frame, FIG. 5 showing such a device 40 bonded to a lead frame supporting member 41 included in the support according to the present invention. In this case the area of the major wafer face of the semiconductor device 40 to be bonded to the support is too large for a single gold spherical particle of a diameter convenient to be handled to be sufficient to ensure that a support is provided to which the integrated circuit 41 may be bonded without a propensity for undesirable voids to be formed in the intermediate bonding layer. These voids may cause the packaged semiconductor device to be faulty even when, as shown in FIG. 5, the intermediate bonding layer does not form an electrical interconnection between the device 40 and the lead frame 41, but because the device may not be securely bonded to the lead frame supporting member. However, as is shown in FIG. 6, four gold spherical particles 42 held in contact with four suction tools 43 are transported simultaneously adjacent to each other on the selected part 44 of the lead frame 41. These particles 42 are then simultaneously impacted and form a substantially continuous gold layer 45 on the nickel-iron-cobalt alloy lead frame 41 coated with silver 46, as illustrated in FIG. 7, the method of impacting the selected part of the lead frame with gold otherwise being the same as that described above with reference to FIGS. 1 to 4. Subsequently the integrated circuit 40 is bonded to the selected part 44 of the lead frame and gold wire electrical interconnections 47 are bonded by thermo-compression techniques both to the device contacts and to the constituent conductors 48 of the lead frame 41 as is shown in FIG. 5. A so-called "flat-pack" (not shown) is then provided by encapsulating the device 40 with epoxy resin, and the conductors 48 are removed from the remainder of the lead frame and extend externally of the epoxy resin. Again a plurality of devices may be bonded simultaneously to a corresponding plurality of lead frames in the form of a preformed, integral, strip.

The spherical gold particles used in one particular method of manufacturing supports according to the present invention are 0.01 inch in diameter and are securely held in contact with an orifice of a suction tool of 0.005 inch diameter. Each of these particles produces on a supporting member a gold layer which has a maximum diameter of approximately 0.03 inch, and semiconductor device 0.015 inch square is bonded to this gold layer. When four spherical gold particles each of 0.01 inch in diameter are used to manufacture a support in the manner illustrated in FIGS. 5 to 7 the maximum overall diameter of the gold layer is approximately 0.05 inch and a semiconductor device 0.035 inch square is bonded to the support. The weight applied to the impacting tool is approximately 100 pounds, and the weight applied to the nozzle of the suction tool is of the order of 2.5 pounds.

Means other than the suction tool may be employed to select and to transport the spherical gold particles with respect to the impacting tool. A reliable way of selecting the spherical particles is to arrange to pass a plurality of such particles over a surface, depressions of appropriate dimensions being provided in the surface at the positions where the particles are required to be located.

A satisfactory bond in order to manufacture a support for a semiconductor wafer device according to the present invention may be provided between a gold particle and a selected part of a supporting member having a gold, silver, copper or aluminum surface. It is also possible to obtain a satisfactory bond between particles of silver, or aluminum or copper and a surface of any one of these metals or of gold. In forming a satisfactory bond it is essential to alloy together the bonding regions. Whilst alloying occurs at a rate proportional to temperature, and even occurs at an insignificant rate at room temperatures, in order to avoid work hardening of the metals it is essential that the application of pressure by the impacting tool takes place at a temperature above the recrystallisation temperature of each metal. In accordance with the present invention, with some combinations of metals for the particle and the surface of the selected part of the supporting member, if the particle is impacted under a high enough pressure a satisfactory bond is obtained and work hardening is avoided without the application of heat during the bonding operation. With other such combinations for the metals it may be essential or desirable that heat is supplied during the bonding operation in order to avoid work hardening and to obtain a satisfactory bond, as described and claimed in the applicant's co-pending application Ser. No. 27,478, the present application being a continuation-in-part of Ser. No. 27,478.

Further, when bonding a particle to a supporting member in accordance with the present invention, it is necessary in deforming the metals to push aside the inevitable oxide skin at the bonding area. In deforming the particle material it is required to cause this material to spread sufficiently thickly over the whole of the selected part of the supporting member to form an intermediate bonding layer of the required form between the semiconductor wafer and the supporting member.

What we claim is:

1. A method of manufacturing a support for a semiconductor device comprising the steps of providing a supply of spherical particles of a suitable bonding material, selecting any one of such particles, transporting the selected particle to and depositing it on a selected part of a supporting member, and bonding said particle to the selected part by impacting substantially the whole of the particle into the surface of said selected part by an unheated impacting tool to thereby deform the selected part and bond the selected particle to the supporting member at the location of the selected part.

2. A method as claimed in claim 1 in which, in addition to the selection of said one particle, at least one further particle is selected from the supply, said one selected particle and each further selected particle being transported onto the selected part of the supporting member, the selected particles adjacent to each other being bonded on the selected part by impacting substantially the whole of the particles into the surface of the selected part and so causing the particles to form a single region of the particle material at the location of the selected part.

3. A method as claimed in claim 1 in which the material of each particle is such that the device is to be bonded to the support by the semiconductor material of the device forming a eutectic mixture with the particle material, the mixture comprising an intermediate bonding layer between the device and the support.

4. A method as claimed in claim 1 in which the material of each particle is gold, and a surface layer, at least, of the selected part of the supporting member is of silver.

5. A method as claimed in claim 1 in which each particle is selected by a suction means having a nozzle with a circular orifice of diameter smaller than the diameter of the spherical particle, the selected particle being securely held in contact with the orifice and acting as a shut-off valve for the suction means.

6. A method as claimed in claim 5 in which the transportation of each selected particle is effected by relative movement between the suction means and the selected part of the supporting means.

7. A method as claimed in claim 6 in which each selected particle is initially secured to the selected part of the supporting member by being impacted onto the selected part by the suction means prior to said deformation of the selected part by the impacting tool.

8. A method of manufacturing a support for the semiconductor device comprises the steps of providing a supply of spherical particles of a suitable bonding material, selecting any one of such particles by a suction means, trans-porting the selected particle by said suction means to and depositing it on a selected part of a supporting member while simultaneously deforming the deposited particle, and impacting said particle with an unheated impacting tool with sufficient force to cause a deformation in the supporting member beneath said particle and to effect a bond between said particle and the selected part.

9. A method as claimed in claim 8 in which, in addition to the selection of said one particle, at least one further particle is selected, said one selected particle and each further particle being transported onto the selected part of the supporting member and being deposited thereon closely adjacent each other, the closely adjacent selected particles being bonded on the selected part by simultaneous impact on the particles causing the particles to flow into each other and form a substantially continuous layer.

10. A method as claimed in claim 8 in which said deformation in the supporting member is saucer shaped.

* * * * *

UNITED STATES PATENT OFFICE
CERTIFICATE OF CORRECTION

Patent No. 3,762,029 Dated October 2, 1973

Inventor(s) Sydney Jackson et al.

It is certified that error appears in the above-identified patent and that said Letters Patent are hereby corrected as shown below:

Cover page, after item [63] insert --
[30] Foreign Application Priority Data
April 26, 1969 Great Britain 21401/69--.
Column 8, line 7, "trans-porting" should read --transporting--.

Signed and sealed this 29th day of January 1974.

(SEAL)
Attest:

EDWARD M.FLETCHER,JR.
Attesting Officer

RENE D. TEGTMEYER
Acting Commissioner of Patents